United States Patent
Ohkubo

[19]

[11] Patent Number: 6,133,586
[45] Date of Patent: Oct. 17, 2000

[54] SEMICONDUCTOR MEMORY DEVICE AND METHOD OF FABRICATING THE SAME

[75] Inventor: Hiroaki Ohkubo, Tokyo, Japan

[73] Assignee: NEC Corporation, Tokyo, Japan

[21] Appl. No.: 08/825,172

[22] Filed: Mar. 28, 1997

[30] Foreign Application Priority Data

Mar. 29, 1996 [JP] Japan ..................................... 8-076097

[51] Int. Cl.[7] .......................... H01L 29/76; H01L 31/036; H01L 31/112
[52] U.S. Cl. .............................. 257/66; 257/756; 257/903
[58] Field of Search ................................. 257/57, 66, 74, 257/756, 903

[56] References Cited

U.S. PATENT DOCUMENTS

| 4,398,341 | 8/1983 | Geipel, Jr. et al. ........................ | 29/578 |
| 5,734,179 | 3/1998 | Chang et al. .............................. | 257/67 |

FOREIGN PATENT DOCUMENTS

| 4-321274 | 11/1992 | Japan . |
| 5-13766 | 1/1993 | Japan . |
| 6-196657 | 7/1994 | Japan . |
| 7-30126 | 1/1995 | Japan . |

OTHER PUBLICATIONS

T.F. McNelly et al.; "High Performance 0.25μm SRAM Technology with Tungsten Interpoly Plug"; IEDM 95–927; IEEE (1995), pp. 36.7.1–36.7.4.

K. Tsutsumi et al.; "A High–Performance SRAM Memory Cell With LDD–TFT Loads"; LSI Research and Development Laboratory, Mitsubishi Electric Corp.; pp. 23–24.

*Primary Examiner*—Sara Crane
*Attorney, Agent, or Firm*—McGuireWoods, LLP

[57] ABSTRACT

There is provided a semiconductor memory device including a semiconductor substrate, a pair of transfer transistors formed on the substrate, a pair of driver transistors formed on the substrate, first and second thin film load transistors formed above the transfer transistors and the driver transistors with an interlayer insulative film sandwiched therebetween, a drain region of the first thin film load transistor having at least one portion over which a gate electrode of the second thin film load transistor partially lies. The portion is heavily doped with impurities. The above mentioned semiconductor memory device prevents reduction in ON-state current in thin film transistors, and hence improves stability in operation of SRAM cell having a top gate type thin film transistor.

5 Claims, 10 Drawing Sheets

SEMICONDUCTOR MEMORY DEVICE AND METHOD OF FABRICATING THE SAME

BACKGROUND OF THE INVENTION

1. Field of the Invention

The invention relates to a semiconductor memory device and a method of fabricating the same, and more particularly to an improvement for SRAM cell in which MOSFET formed on a semiconductor substrate is electrically connected to a thin film transistor formed above the MOSFET with an insulating film sandwiched therebetween.

2. Description of the Related Art

As one of conventional SRAM memory cells is known a semiconductor memory cell including a pair of transfer transistors and a pair of driver transistors both of which are formed on a semiconductor substrate, and a pair of thin film load transistors (hereinafter, a thin film transistor is referred to simply as "TFT") which are formed above the transfer and driver transistors with an insulating film sandwiched therebetween and which are in electrical connection with the transfer and driver transistors. A conventional memory cell having a top gate TFT is explained hereinbelow with reference to FIGS. 1, 2A, 2B, 3 and 4A to 4D.

Figure 1:
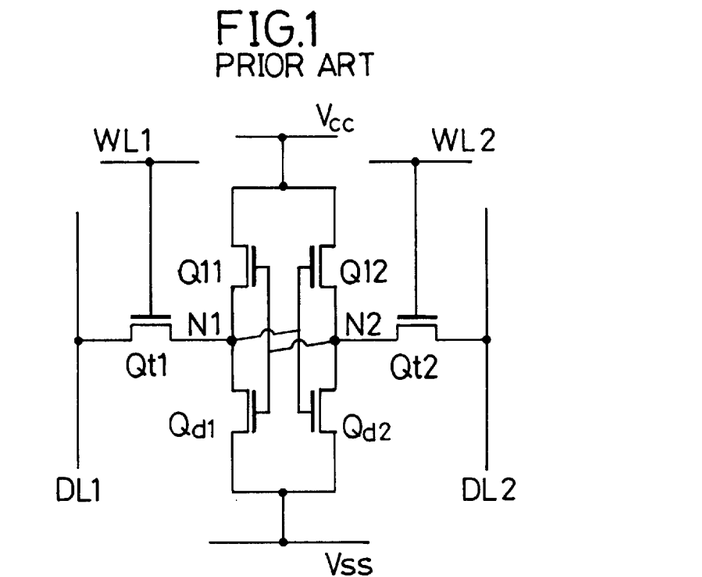
FIG. 1 is an equivalent circuit diagram of a TFT load SRAM cell.

FIG. 1 is a circuit diagram of SRAM cell. The illustrated SRAM cell is comprised of a flip flop circuit and two transfer transistors Qt1 and Qt2. The flip flop circuit includes two driver transistors Qd1 and Qd2, and two thin film load transistors Ql1 and Ql2. In a cell array, a complementary bit line DL1 and a word line WL1 are electrically connected to a source/drain terminal and a gate electrode of the transfer transistor Qt1, respectively, and similarly, a complementary bit line DL2 and a word line WL2 are electrically connected to a source/drain terminal and a gate electrode of the transfer transistor Qt2.

The driver transistors Qd1 and Qd2 have source terminals electrically connected to a grounding wire Vss, and drain terminals connected to both source/drain terminals of the transfer transistors Qt1 and Qt2 and drain terminals of the load transistors Ql1 and Ql2 through nodes N1 and N2, respectively. The load transistors Ql1 and Ql2 have source terminals electrically connected to a power source wire Vcc. The driver transistor Qd1 and the load transistor Ql1 both have gate terminals electrically connected to the node N2, and the driver transistor Qd2 and the load transistor Ql2 both have gate terminals electrically connected to the node N1. The driver transistors Qd1 and Qd2 and the load transistors Ql1 and Ql2 connected in such a manner as above mentioned cooperate with each other to constitute a flip flop circuit.

In the illustrated SRAM cell, the driver transistors Qd1 and Qd2 and the transfer transistors Qt1 and Qt2 are all n-channel MOSFETs, and the load transistors Ql1 and Ql2 are p-channel MOSFETs. Data are stored in the illustrated SRAM cell in dependence on two stable states of the flip flop circuit working as a bistable circuit. For example, when the node N1 is at a higher level and the node N2 is at a lower level, data is stored as "1", whereas when the node N1 is at a lower level and the node N2 is at a higher level, data is stored as "0".

Figure 2A:
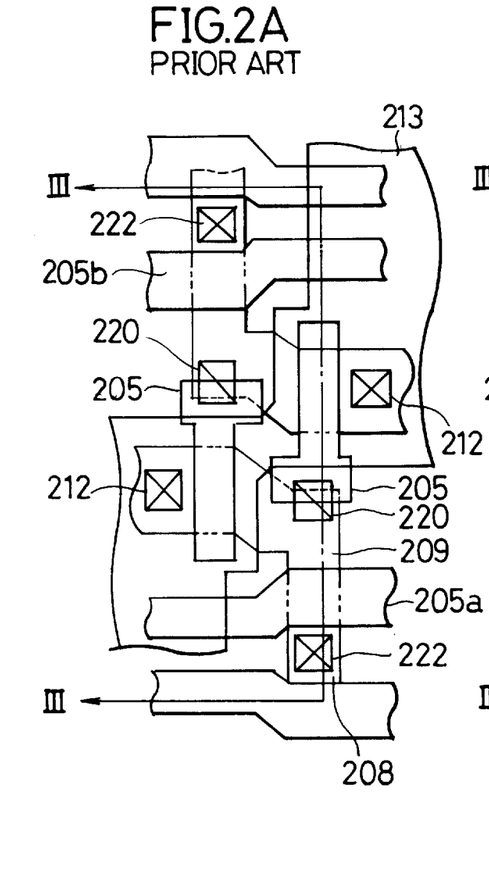
FIG. 2A is a plan view of a conventional TFT load SRAM cell, illustrating MOSFET section thereof.
Figure 2B:
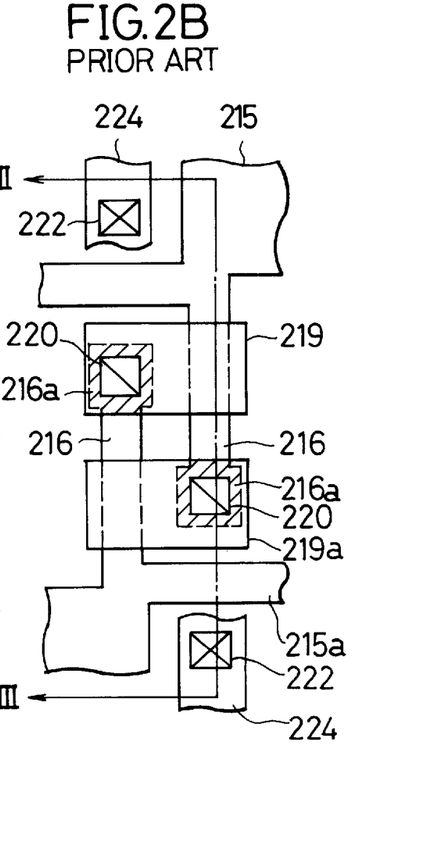
FIG. 2B is a plan view of a conventional TFT load SRAM cell, illustrating TFT section thereof.

FIGS. 2A and 2B illustrate a TFT load SRAM unit cell. FIG. 2A illustrates MOSFET section of the cell, whereas FIG. 2B illustrates TFT section of the cell. Unit cells located adjacent to the illustrated unit cell are in mirror-symmetry relation with the illustrated unit cell about long and short sides thereof. Thus, a contact hole is partially shared by the illustrated unit cell and unit cells located adjacent thereto.

Figure 3:
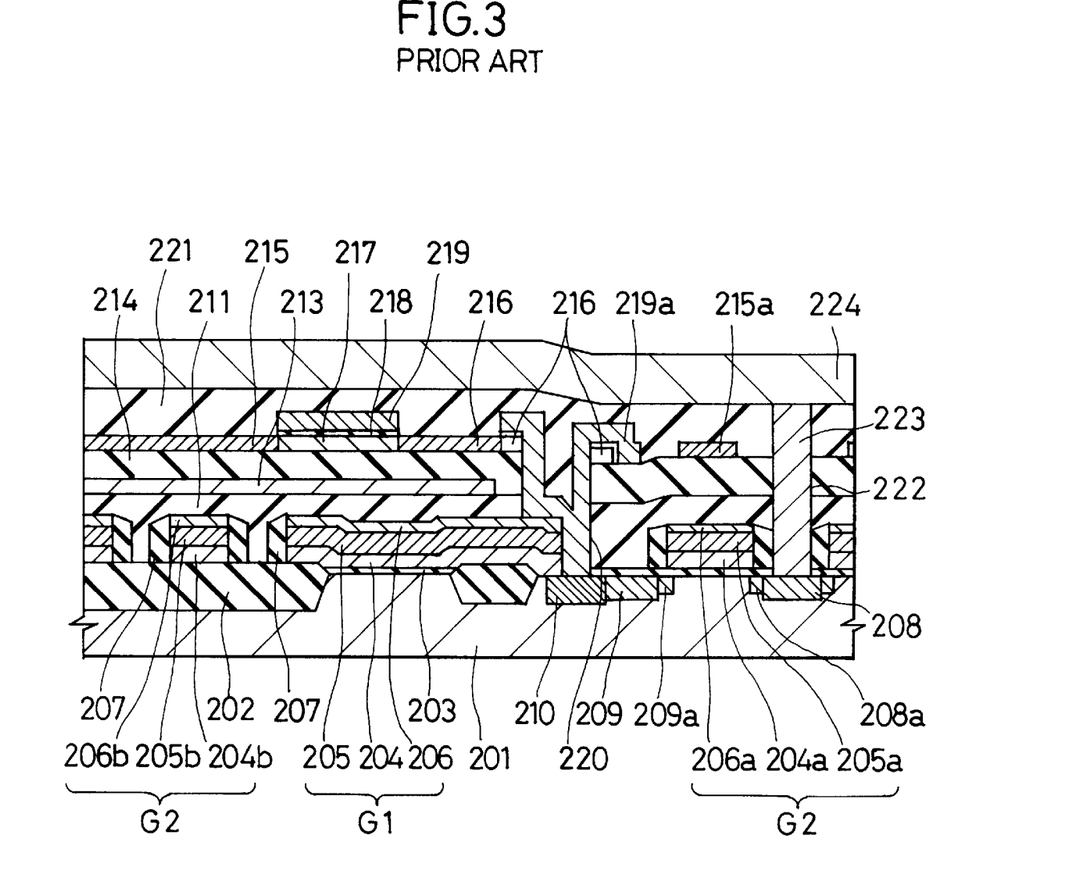
FIG. 3 is a cross-sectional view taken along the line III—III in FIGS. 2A and 2B.

FIG. 3 is a cross-sectional view taken along the line III—III in FIGS. 2A and 2B. As illustrated in FIG. 3, field oxide films 202 are formed on a silicon substrate 201, and a gate oxide film 203 is formed in a device activation region on the silicon substrate 201. On the field oxide film 202 and the gate oxide film 203 is formed a gate electrode GI of a driver transistor which comprises a three-layered structure including a polysilicon film 204, a tungsten silicide film 205 and a silicon film 206 deposited in this order (FIG. 2A illustrates only the tungsten silicide film 205 for simplification). Similarly on the gate oxide film 203 is formed a gate electrode G2 of a transfer electrode or a word line, comprising a polysilicon film 204a, a tungsten silicide film 205a and a silicon film 206a deposited in this order. Sidewalls of the gate electrodes G1 and G2 are covered with sidewall insulating films 207. The silicon substrate 201 is formed at a surface thereof with N− diffusion layers 208a and 209a and further with N+ diffusion layers 208 and 209 which are located adjacent to and making contact with the N− diffusion layers 208a and 209a. A gate electrode G2 of another transfer transistor is formed on the field oxide film 202. The gate electrode G2 of another transfer transistor acting as another word line is comprised of a polysilicon film 204b, a tungsten silicide film 205b, and a silicon film 206b.

The above mentioned components are covered with a first interlayer insulating film 211 on which in turn is formed a grounding wire 213. The grounding wire 213 is connected to diffusion layers (not illustrated) formed in the silicon substrate 201 through a contact hole 212 (see FIG. 2A).

As illustrated in FIGS. 2B and 3, a second interlayer insulating film 214 is deposited over the first interlayer insulating film 211. TFT is formed on the second interlayer insulating film 214 above the grounding wire 213. TFT working as a load transistor includes a TFT source region 215, a TFT drain region 216, a TFT channel region 217 disposed between the source and drain regions 215 and 216, and lightly impurity-doped regions 216a one of which is located adjacent to the TFT drain region 216 and the other is spaced away by a contact hole 220. On the TFT channel region 217 is formed a TFT gate insulating film 218, on which is formed TFT gate electrodes referenced with numerals 219 and 219a. The TFT gate electrode 219a is in contact at a bottom of the contact hole 220 with the silicon film 206, the tungsten silicide film 205, the polysilicon film 204 and a N+ diffusion layer 210.

As illustrated in FIGS. 2B and 3, TFT having the above mentioned structure is covered with a third interlayer insulating film 221, on which a bit line 224 made of aluminum is formed. Thus, a TFT load SRAM cell is completed. The bit line 224 is in contact with the N+ diffusion layer 208 through a bit line contact plug 223 filling a bit line contact hole 222 therewith. The plug 223 is made of tungsten.

Figure 4A:
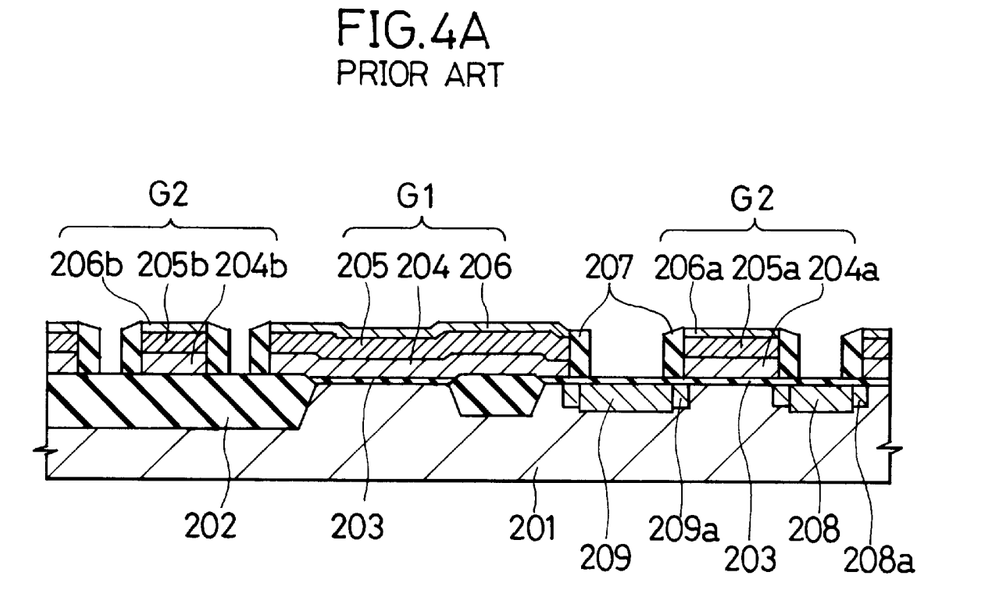
FIGS. 4A to 4D are cross-sectional views of the conventional TFT load SRAM cell illustrated in FIGS. 2A, 2B and 3, showing respective steps of a method of fabricating the same.

FIGS. 4A to 4D illustrate cross-sectional views of the above mentioned SRAM cell, showing fabrication steps of a method of fabricating the same. First, as illustrated in FIG. 4A, the field oxide films 202 are formed on the p-type silicon substrate 201, and the gate oxide film 203 is formed in a device activation region, namely in a region defined between the field oxide films 202. Then, the gate electrode G1 of a driver transistor is formed in the device activation region on the gate oxide film 203. The gate electrode G1 is formed by depositing the polysilicon film 204, the tungsten silicide film 205 and the silicon film 206 on the gate oxide film 203 in this order, and further patterning them by means of photolithography and etching. Similarly, the gate electrodes G2 of the transfer transistors, which act as word lines, are formed on the gate oxide film 203. The gate electrodes G2 are comprised of polysilicon films 204a and 204b, tungsten silicide films 205a and 205b, and silicon films 206a and 206b. The gate electrodes G2 are formed in the same manner as that of the gate electrode G1.

Then, ion implantation is carried out to the silicon substrate 201 by using the gate electrode G2 as a mask to thereby form lightly impurity-doped diffusion layers or N− diffusion layers 208a and 209a in the silicon substrate 201. Then, the sidewall insulating films 207 made of silicon dioxide are formed on sidewalls of the gate electrodes G1 and G2. Then, ion implantation is carried out to the silicon substrate 201 with the gate electrodes G1 and C2 and the sidewall insulating films 207 being used as a mask to thereby form the heavily impurity-doped diffusion layers or N+ layers 208 and 209 located adjacent to the N− diffusion layers 208a and 209a formed just below the sidewall insulating films 207.

Figure 4B:
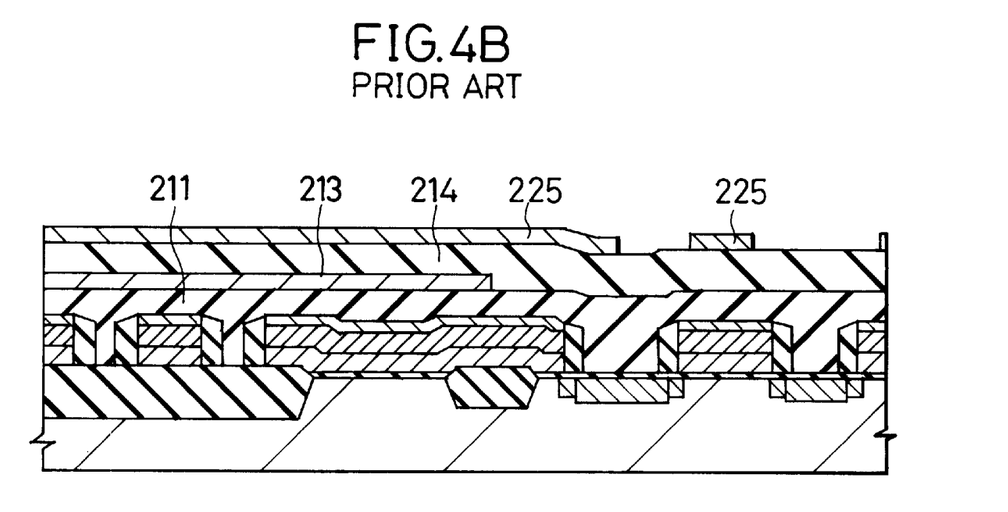

Then, as illustrated in FIG. 4B, a resultant is covered with the first interlayer insulating film 211 made of silicon dioxide by means of chemical vapor deposition (CVD). Then, there is formed the grounding wire 213 on the first interlayer insulating film 211. Then, the grounding wire 213 and the first interlayer insulating film 211 are covered with the second interlayer insulating film 214, on which in turn is formed a silicon film 225 from which TFT will be made.

Figure 4C:
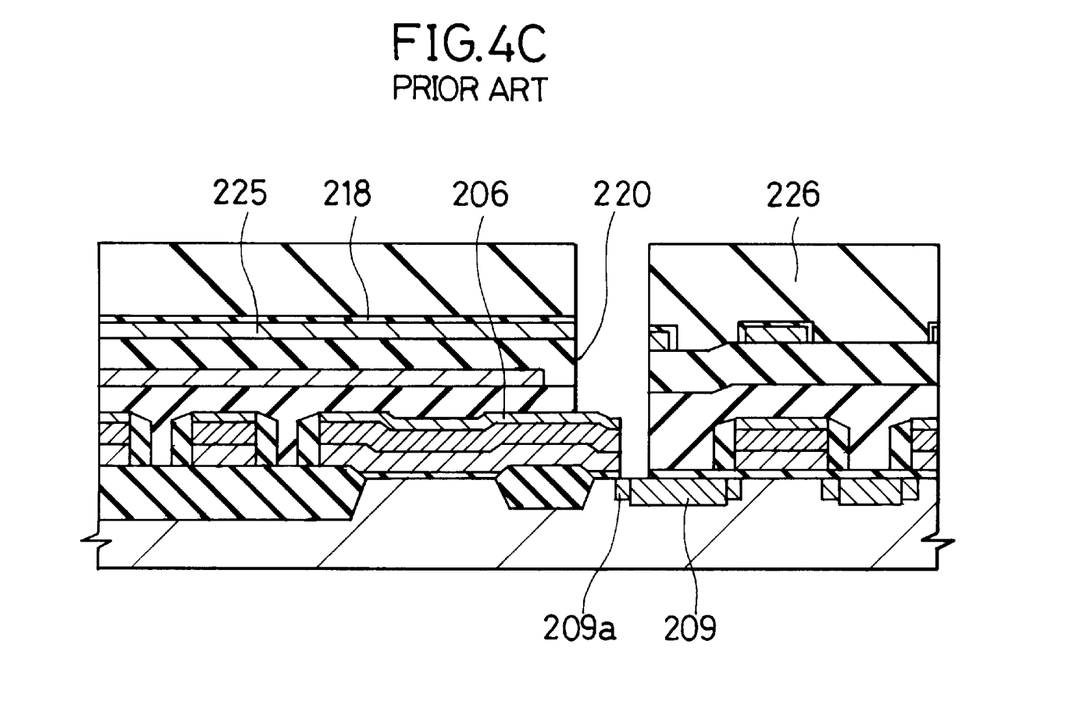

Then, as illustrated in FIG. 4C, a TFT gate insulating film 218 having a thickness of about 20 nm is formed over the silicon film 225. Then, a patterned resist mask 226 is formed over a resultant, and thereafter there is formed the contact hole 220 with the resist mask 226 being used as an etching mask. The silicon film 206, the N+ diffusion layer 209 and the N− diffusion layers 209a appear in the contact hole 220.

Figure 4D:
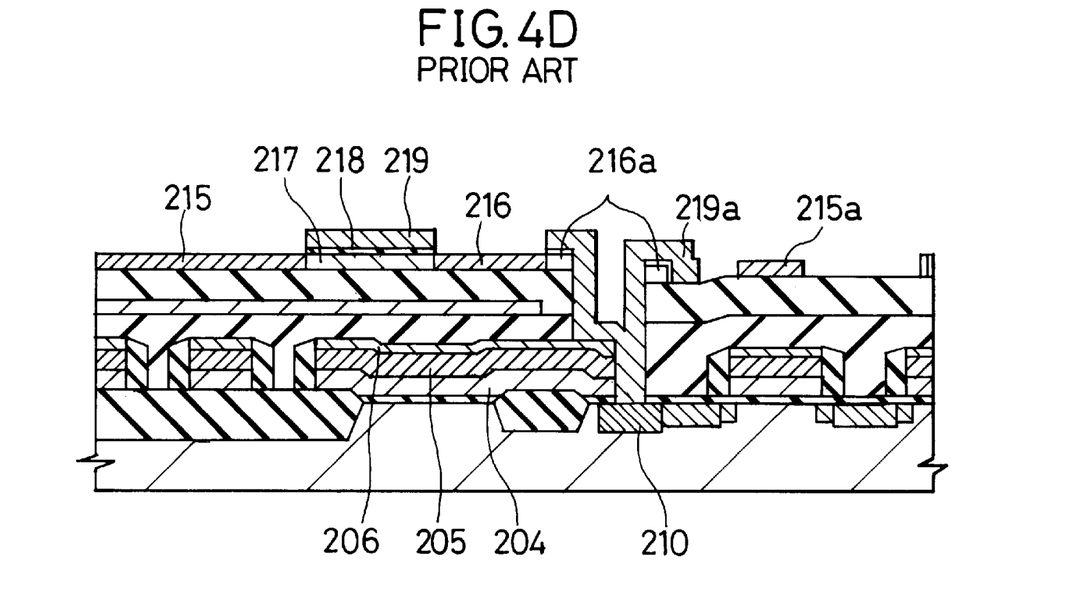

Then, as illustrated in FIG. 4D, there are formed the TFT gate electrodes 219 and 219a. The TFT gate electrode 219a is in contact at a bottom of the contact hole 220 with the silicon film 206, the tungsten silicide film 205, the polysilicon film 204 and the N+ diffusion layer 210.

Then, boron ion is implanted into the TFT silicon film 225 with the TFT gate electrodes 219 and 219a being used as a mask to thereby form the TFT source regions 215 and 215a and the TFT drain region 216. However, it should be noted that boron ions are not implanted into portions 216a of the TFT silicon film 225 located just beneath the TFT gate electrode 219a, because the TFT gate electrode 219a acts as a mask to thereby not allow boron ions to be introduced into the portions 216a.

Then, as illustrated in FIG. 3, TFT is entirely covered with the third interlayer insulating film 221, on which the bit line 224 made of aluminum is formed. Thus, a TFT load SRAM cell is completed. The bit line 224 is in contact with the N+ diffusion layer 208 through the bit line contact plug 223 filling the bit line contact hole 222 therewith. The bit line contact plug 223 is made of tungsten.

The above mentioned TFT load SRAM cell and the method of fabricating the same have problems as follows. The first problem is a reduction in current capability or ON-state current of TFT, which in turn causes stability of SRAM cell to lower. In particular, a voltage at a higher level node of a cell is not sufficiently high immediately after data has been written thereinto, data in a cell is not in stable condition. When a current flow into the higher level node from the power source Vcc through TFT, the higher level node is charged and thus transfers into stable condition. However, if current capability or ON-state current of TFT is low, it takes much time for data stored in a cell to become stable. Thus, it is often quite difficult to exactly read out the stored data immediately after data has been written into SRAM cell, and data destruction or soft error would readily take place due to external noises, in particular, radiation.

The reason why the current capability of TFT is reduced is that the silicon film 225 is formed with a high resistance region in the TFT drain region 216 in the vicinity of a contact hole connecting TFT to MOSFET, which region contains no impurities therein or contains impurities only at a low concentration. The region corresponds to the lightly impurity-doped regions 216a illustrated in FIG. 2B and FIG. 3.

The above mentioned high resistance region may be reduced with respect to a resistance by carrying out annealing to thereby thermally diffuse impurities therein after impurities are implanted into the TFT source/drain regions. However, with a semiconductor memory device being more highly integrated and a semiconductor element becoming finer in size, annealing is required to carry out at a lower temperature to thereby depress thermal diffusion of impurities, in order to prevent a channel of MOSFET from becoming shorter. Thus, it is considered that the above mentioned problem about the high resistance region in a top gate TFT will become remarkable.

There has been suggested a SRAM memory cell with polysilicon LDD-PMOS TFT loads by K. Tsutsumi et al., "A high-performance SRAM memory cell with LDD-TFT loads", pp. 23–24.

There has been also suggested a 0.25 $\mu$m CMOS process for fast static RAMs featuring 0.25 $\mu$m polycide gate surface channel NMOS and PMOS transistors with drive currents of 630 and 300 $\mu A/\mu m$ respectively at an off-leakage of 10 pA/$\mu$m, by T. F. McNelly et al., "High Performance 0.25 $\mu$m SRAM Technology with Tungsten Interpoly Plug", IEEE, 1995, pp. 36.7.1–36.7.4.

SUMMARY OF THE INVENTION

In view of the foregoing problems of prior SRAM cells, it is an object of the present invention to prevent reduction in current capability or ON-state current in SRAM cell having a top gate TFT, and thereby enhance stability in operation of SRAM cell having a top gate TFT.

In one aspect, there is provided a semiconductor memory device, including (a) a semiconductor substrate, (b) a pair of transfer transistors formed on the substrate, (c) a pair of driver transistors formed on the substrate, (d) first and second thin film load transistors formed above the transfer transistors and the driver transistors with an interlayer insulative film sandwiched therebetween, a drain region of the first thin film load transistor having at least one portion over which a gate electrode of the second thin film load transistor partially lies, the portion being heavily doped with impurities.

There is further provided a semiconductor memory device, including (a) a semiconductor substrate, (b) a pair of transfer transistors formed on the substrate, (c) a pair of driver transistors formed on the substrate, (d) first and second thin film load transistors formed above the transfer transistors and the driver transistors with an interlayer insulative film sandwiched therebetween, a drain region of the first thin film load transistor having at least one portion over which a gate electrode of the second thin film load transistor partially lies, the portion being heavily doped with impurities, the gate electrode of the second thin film load transistor having a two-layered structure including upper and lower layers.

The upper and lower layers may be made of polysilicon. It is preferable that the upper layer contains impurities have conductivity opposite to conductivity of the semiconductor substrate. It is also preferable that an inner surface of a contact hole electrically connecting a gate electrode of the driver transistors to a drain region of the first thin film load transistor is covered only with the upper layer.

In another aspect, there is provided a method of fabricating a semiconductor memory, including the steps of (a) forming a pair of transfer transistors and a pair of driver transistors on a semiconductor substrate, (b) forming an interlayer insulating film entirely covering the transfer transistors and the driver transistors therewith, (c) forming a silicon film in a pattern over the interlayer insulative film, (d) forming a gate insulating film over the silicon film, (e) forming a mask insulating film having a hole through which the gate insulating film is exposed, (f) heavily doping impurities to a portion the silicon film through the hole by using the mask insulating film as a mask, (g) forming sidewall masks at a sidewall of the hole, (h) forming a contact hole in both the silicon film and the interlayer insulating film by using the mask insulating film and the sidewall mask as an etching mask, the contact hole reaching a gate electrode and source/drain regions of the driver transistors, (i) removing the mask insulating film and the sidewall mask, (j) forming an electrically conductive film in a pattern so that the electrically conductive film covers the portion of the silicon film into which impurities have been heavily doped, and further covers an inner surface of the contact hole, and (k) doping impurities into the silicon film except the portion by using the electrically conductive film as a mask.

The electrically conductive film may be formed in the step (j) so that the portion of the silicon film into which impurities have been heavily doped is partially uncovered with the electrically conductive film.

There is further provided a method of fabricating a semiconductor memory, including the steps of (a) forming a pair of transfer transistors and a pair of driver transistors on a semiconductor substrate, (b) forming an interlayer insulating film entirely covering the transfer transistors and the driver transistors therewith, (c) forming a silicon film in a pattern over the interlayer insulative film, (d) forming a gate insulating film over the silicon film, (e) forming a second silicon film covering the gate insulating film and the interlayer insulating film, (f) forming a mask insulating film having a hole through which the second silicon film is exposed, (g) heavily doping impurities to a portion the silicon film through the hole by using the mask insulating film as a mask, (h) forming sidewall masks at a sidewall of the hole, (i) forming a contact hole in the second silicon film, the silicon film and the interlayer insulating film by using the mask insulating film and the sidewall mask as an etching mask, the contact hole reaching a gate electrode and source/drain regions of the driver transistors, (j) removing the mask insulating film and the sidewall mask, (k) forming an electrically conductive film in a pattern so that the electrically conductive film covers a portion of the second silicon film located above the portion of the silicon film into which impurities have been heavily doped, and further covers an inner surface of the contact hole, and (l) doping impurities into the silicon film except the portion by using the electrically conductive film as a mask.

The above mentioned method further includes the steps of (m) forming a second interlayer insulating film over a resultant, and (n) forming a metal film over the second interlayer insulating film, the metal film electrically connecting with a heavily doped diffusion layer formed in the semiconductor substrate.

It is preferable that the hole formed in the step (f) has a larger diameter than a diameter of the contact hole formed in the step (i). The silicon film may be made of polysilicon. Similarly, the second silicon film may be made of polysilicon. The second silicon film may contain impurities having conductivity opposite to conductivity of the semiconductor substrate.

For instance, when a semiconductor memory device fabricated in accordance with the present invention is applied to SRAM having a top gate TFT, a drain region of first TFT is connected through a heavily impurity-doped region to a gate electrode of second TFT disposed adjacent to the first TFT. This brings merits as follows.

The first merit is that a reduction in current capability of a top gate TFT can be prevented. Thus, it is possible to keep SRAM cell stable in operation. The reason is that at least a portion of a silicon film constituting a drain region of one of TFTs, located just beneath a gate electrode of the other TFT, is caused to have a smaller resistance by impurity implanting thereinto, in the vicinity of a contact hole connecting TFT to MOSFET, resulting in that there is no longer formed a high resistance region between the drain region of one of TFTs and the contact hole.

The second merit is that the above mentioned reduction in current capability of a top gate TFT can be accomplished without excessive steps of forming a photoresist mask and photolithography steps. The reason is as follows. Before impurities are implanted to source/drain regions with a TFT gate electrode being used as a mask, impurities are in advance implanted by using a mask insulating film to a silicon film which is located in the vicinity of a contact hole connecting TFT to MOSFET and which will make a drain region of TFT. Then, sidewall insulating films are formed on a sidewall of the mask insulating film, and thereafter there is formed a second contact hole with the mask insulating film and the sidewall insulating films being used as a mask. Thus, there is no necessity to add to any further mask forming steps and photolithography steps.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

A semiconductor memory device in accordance with the first embodiment of the present invention will be explained hereinbelow with reference to FIGS. 5 and 6A to 6D. In the first embodiment, the present invention is applied to a TFT load SRAM cell. The TFT load SRAM cell has the same circuit structure as that of a conventional TFT load SRAM cell illustrated in FIG. 1.

Figure 5:
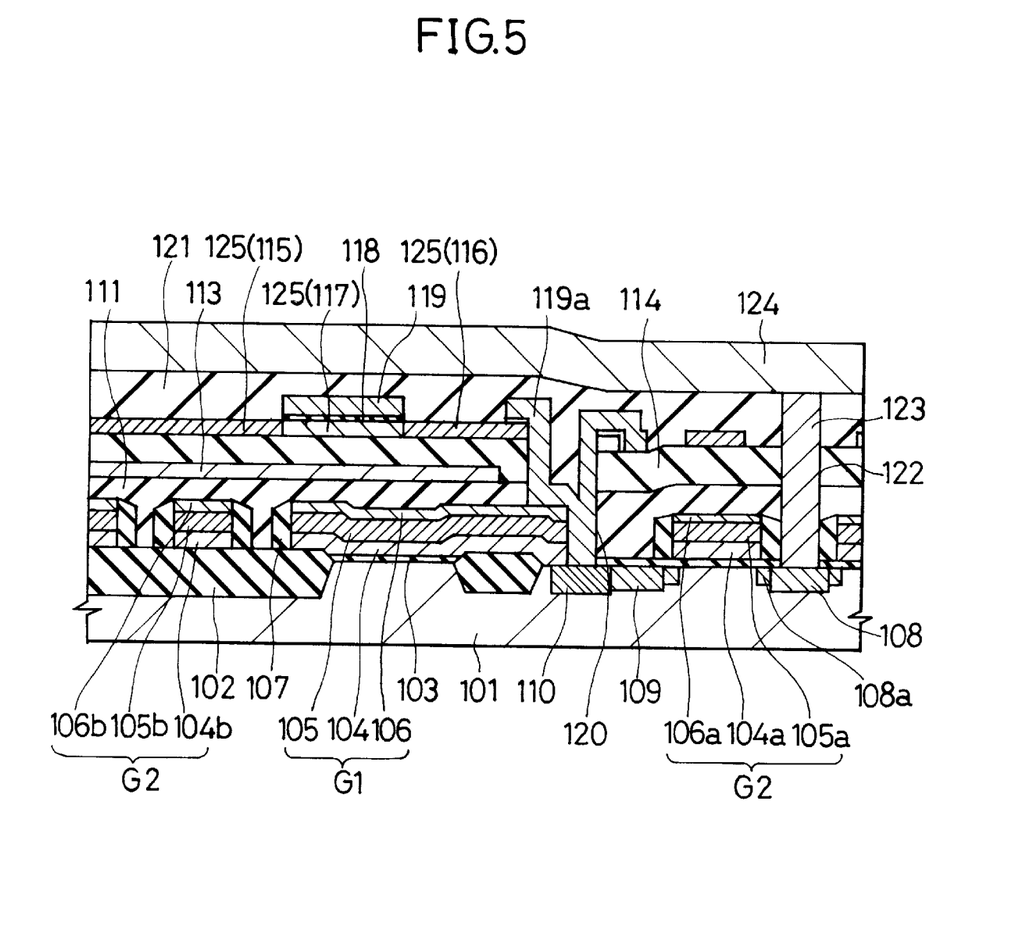
FIG. 5 is a cross-sectional view of a TFT load SRAM cell made in accordance with the first embodiment of the present invention.

Referring to FIG. 5, field oxide films 102 are formed on a silicon substrate 101, and a gate oxide film 103 is formed in a device activation region on the silicon substrate 101. On the field oxide film 102 and the gate oxide film 103 is formed a gate electrode G1 of a driver transistor which comprises a three-layered structure including a polysilicon film 104, a tungsten silicide film 105 and a silicon film 106 deposited in this order. Similarly on the gate oxide film 103 is formed a gate electrode G2 of a transfer electrode or a word line, comprising a polysilicon film 104a, a tungsten silicide film 105a and a silicon film 106a deposited in this order. Sidewalls of the gate electrodes G1 and G2 are covered with sidewall insulating films 107. The silicon substrate 101 is formed at a surface thereof with N– diffusion layers 108a and 109a and further with N+ diffusion layers 108 and 109 which are located adjacent to and making contact with the N– diffusion layers 108a and 109a. A gate electrode G2 of another transfer transistor is formed on the field oxide film 202. The gate electrode G2 of another transfer transistor acting as another word line is comprised of a polysilicon film 104b, a tungsten silicide film 105b, and a silicon film 106b.

The above mentioned components are covered with a first interlayer insulating film 111 on which in turn is formed a grounding wire 113. A second interlayer insulating film 114 is deposited over the first interlayer insulating film 111. There is formed TFT on the second interlayer insulating film 114 above the grounding wire 113. The TFT working as a load transistor includes a TFT silicon film 125 in which a TFT source region 115, a TFT drain region 116, a TFT channel region 117 disposed between the source and drain regions 115 and 116 are formed. Herein, the regions 115, 116 and 117 are referenced with parenthesized numerals in order to indicate that the regions 115, 116 and 117 are portions of the silicon film 125. On the TFT channel region 117 is formed a TFT gate insulating film 118, on which is formed TFT gate electrodes 119 and 119a. The TFT gate electrode 119a makes contact with the TFT drain region 116 at a side surface of the drain region 116, and constitutes a gate electrode of the other TFT in the pair of load transistors Q11 and Q12. The TFT gate electrode 119a has a portion making contact at a bottom of a contact hole 120 with the silicon film 106, the tungsten silicide film 105, the polysilicon film 104 and a N+ diffusion layer 110.

As illustrated in FIG. 5, TFT having the above mentioned structure is covered with a third interlayer insulating film 121, on which a bit line 124 made of aluminum is formed. Thus, a TFT load SRAM cell is completed. The bit line 124 is in contact with the N+ diffusion layer 108 through a bit line contact plug 123 filling a bit line contact hole 122 therewith. The contact plug 123 is made of tungsten.

FIGS. 6A to 6D illustrate cross-sectional views of the above mentioned SRAM cell, showing fabrication steps of a method of fabricating the same.

Figure 6A:
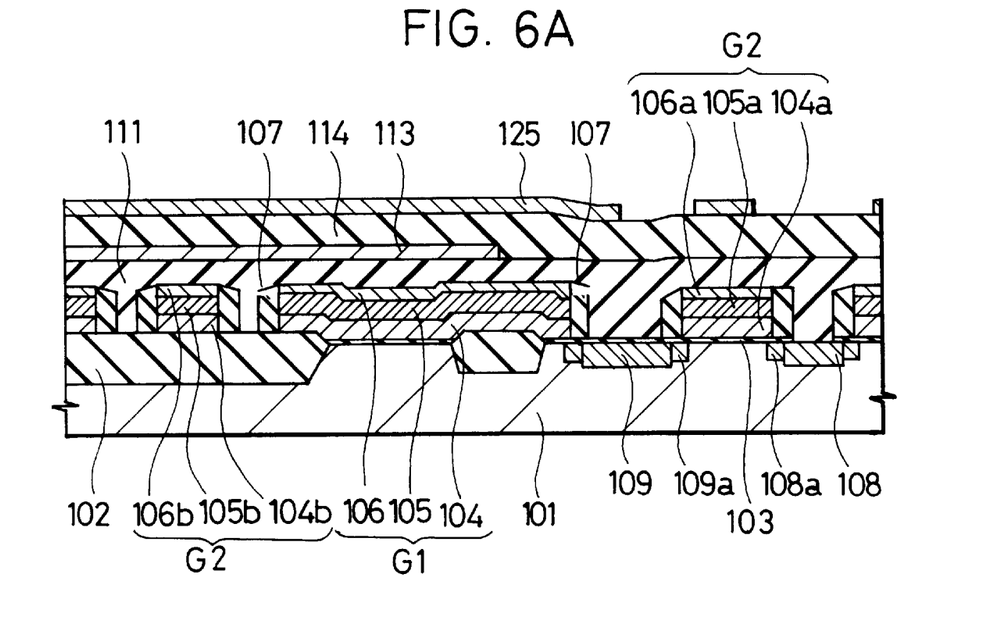
FIGS. 6A to 6D are cross-sectional views of the TFT load SRAM cell illustrated in FIG. 5, showing respective steps of a method of fabricating the same.

First, as illustrated in FIG. 6A, the field oxide films 102 having a thickness in the range of 200 to 500 nm are formed by selective oxidation on the p-type silicon substrate 101 having an impurity concentration in the range of $1\times10^{16}$ to $1\times10^{17}$ cm$^{-3}$. There is further formed the gate oxide film 103 having a thickness of 10 nm in a device activation region at a surface of the silicon substrate 101, namely in a region defined between the field oxide films 102. Then, the gate electrode G1 of a driver transistor is formed in the device activation region on the gate oxide film 103. The gate electrode G1 has a three-layered structure, and is formed by depositing the n-type impurities doped polysilicon film 104 having a thickness in the range of 50 to 200 nm, the tungsten silicide film 105 having a thickness in the range of 10 to 200 nm, and the silicon film 106 having a thickness in the range of 50 to 100 nm, on the gate oxide film 103 in this order, and further patterning them by means of photolithography and etching. Similarly, the gate electrodes G2 of the transfer transistors, which act as word lines, are formed on the gate oxide film 103. The gate electrodes G2 are comprised of polysilicon films 104a and 104b, tungsten silicide films 105a and 105b, and silicon films 106a and 106b. The gate electrodes G2 are formed in the same manner as that of the gate electrode G1. The reason why the silicon films 106, 106a and 106b are formed over the tungsten silicide films 105, 105a and 105b is to prevent the tungsten silicide films 105, 105a and 105b from being damaged due to etch back to be carried out for forming the sidewall insulating films 107 in later steps and dry etching to be carried out for forming the contact hole 120.

Then, ion implantation is carried out to the silicon substrate 101 by using the gate electrode G2 as a mask to thereby form the lightly impurity-doped diffusion layers or N– diffusion layers 108a and 109a at a surface of the silicon substrate 101. The layers 108a and 109a have an impurity concentration in the range of $1\times10^{17}$ to $1\times10^{18}$ cm$^{-3}$. Then, the sidewall insulating films 107 made of silicon dioxide are formed on sidewalls of the gate electrodes G1 and G2. Then, ion implantation is carried out to the silicon substrate 101 with the gate electrodes G1 and G2 and the sidewall insulating films 107 being used as a mask to thereby form the heavily impurity-doped diffusion layers or N+ layers 108 and 109 located adjacent to the N– diffusion layers 108a and 109a formed just below the sidewall insulating films 107. The N+ layers 108 and 109 have an impurity concentration in the range of $1\times10^{20}$ to $1\times10^{21}$ cm$^{-3}$.

Then, a resultant is covered with the first interlayer insulating film 111 made of silicon dioxide by means of CVD. Then, the grounding wire 113 having a thickness in the range of 150 to 300 nm and made of a tungsten silicide film is formed on the first interlayer insulating film 111. Then, the grounding wire 113 and the first interlayer insulating film 111 are covered with the second interlayer insulating film 114, on which in turn is formed the silicon film 125 from which TFT will be made. The silicon film 125 is a polysilicon film having a crystal grain diameter increased by annealing an amorphous silicon film deposited by CVD, at a temperature in the range of 500° C. to 600° C.

Then, as illustrated in FIG. 4B, a TFT gate insulating film 118 having a thickness in the range of 10 nm to 20 nm is formed over the silicon film 125. Then, the patterned resist mask 126 having a thickness in the range of 200 nm to 300 nm is formed over a resultant. The mask insulating film 126 is a silicon nitride film deposited by CVD. Then, there is formed a patterned resist mask 127 over the mask insulating film 126. Then, there is formed a hole 128 in the mask insulating film 126 by anisotropic etching with the resist mask 127 being used as an etching mask. The hole 128 has coaxially a greater diameter than a diameter of the contact hole 120 connecting TFT to MOSFET formed on the silicon substrate 101. For instance, when the contact hole has an inner diameter of 400 nm, the hole 128 is designed to have an inner diameter of 800 nm with 200 nm margins at opposite sides of the contact hole diameter.

Figure 6B:
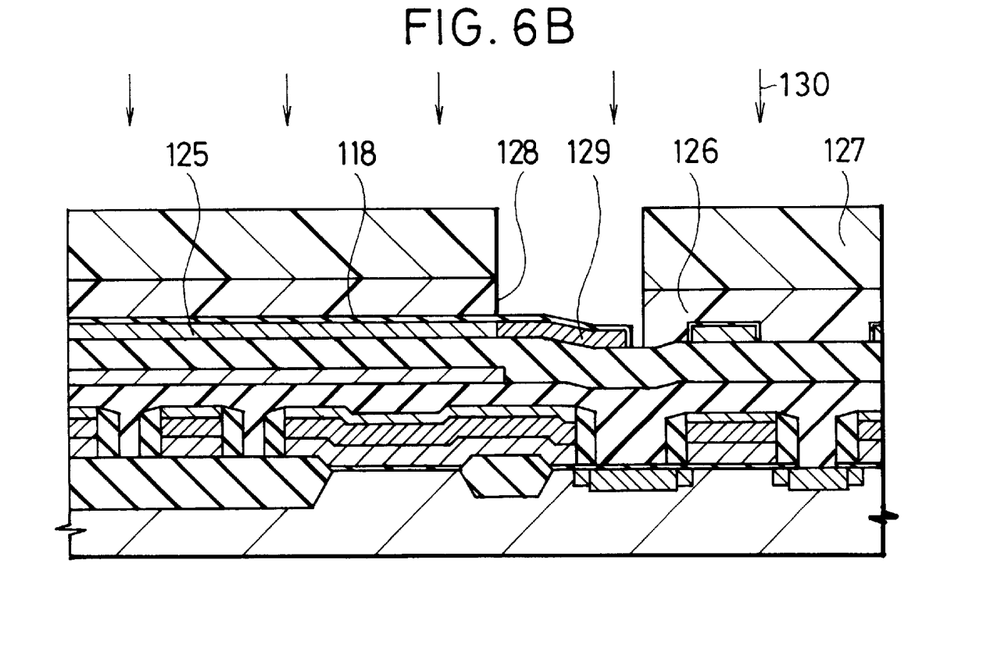

Then, as illustrated in FIG. 6B, boron ions 130 are implanted to the silicon film 125 with the mask insulating film 126 and the resist mask 127 being used as a mask. Thus, there is formed a heavily impurity-doped region 129 in a portion of the silicon film 125 which appears in the hole 128. For instance, the silicon film 125 is implanted at 10 KeV to 30 KeV with doses of $1\times10^{14} - 1\times10^{15}$ cm$^{-2}$.

Figure 6C:
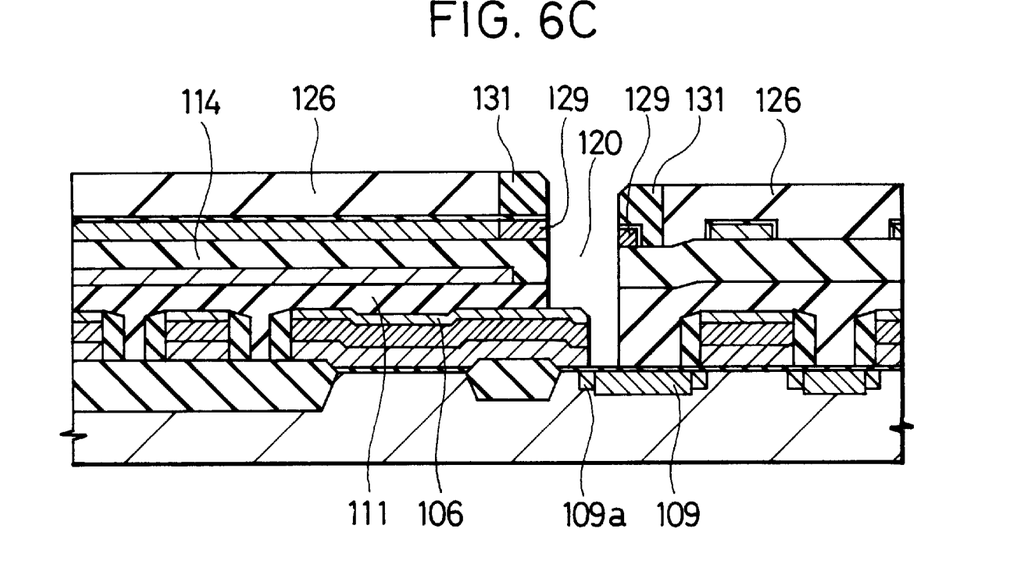

Then, as illustrated in FIG. 6C, the resist mask 127 is removed, and thereafter a silicon nitride film is deposited all over a resultant and then anisotropically etched. Thus, there are formed sidewall masks 131 on an inner wall of the hole 128 and in continuation with the mask insulating film 126.

Then, the heavily impurity-doped region 129, the second interlayer insulating film 114 and the first interlayer insulating film 111 are successively dry etched with the mask insulating film 126 and the sidewall masks 131 being used as an etching mask. Thus, there is formed the contact hole 120 in which the silicon film 106 and the N+ diffusion layer 109 partially appears. The contact hole 120 has an inner diameter defined by a width of the sidewall mask 131, namely a thickness of the silicon nitride film deposited over a resultant. For instance, if the silicon nitride film is designed to have a thickness of 200 nm, the contact hole 120 would have an inner diameter of 400 nm, because the hole 128 has an inner diameter of 800 nm.

Figure 6D:
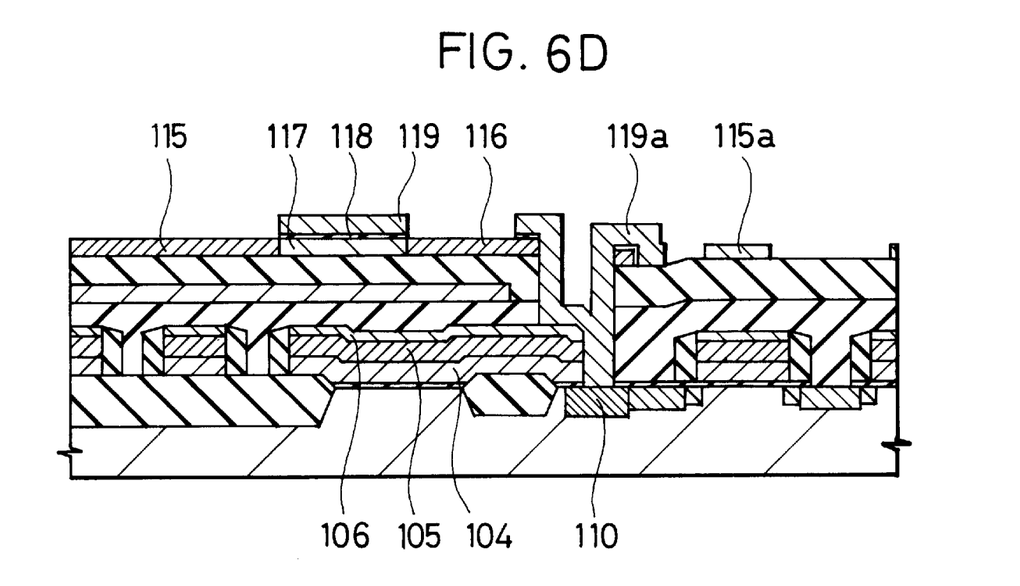

Then, as illustrated in FIG. 6D, after the mask insulating film 126 and the sidewall mask 131 are removed, there are formed the TFT gate electrodes 119 and 119*a* both made of a polysilicon film containing n-type impurities doped thereinto and having a thickness in the range of 50 to 200 nm. The TFT gate electrode 119*a* has a portion which is in contact at a bottom of the contact hole 120 with the silicon film 106, the tungsten silicide film 105, the polysilicon film 104 and the N+ diffusion layer 110.

The TFT gate electrode 119*a* is patterned in such a manner that the TFT gate electrode 119*a* covers the contact hole 120 with a certain margin. Herein, the margin is set to be 100 nm, taking into consideration misregistration between the TFT gate electrode 119*a* and the contact hole 120. Since an inner diameter of the hole 128 and a width of the sidewall masks 131 are determined on the premise of the above mentioned margin, the TFT gate electrode 119*a* is formed so that the heavily impurity-doped region 129 is uncovered with an end of the TFT gate electrode 119*a*.

There is formed a N+ diffusion layer 110 due to impurities diffusion originated from the TFT gate electrode 119*a*, at a portion of a surface of the silicon substrate 101 with which the TFT gate electrode 119*a* makes contact. Then, boron ion implantation is carried out into the TFT silicon film 125 with the TFT gate electrodes 119 and 119*a* being used as a mask to thereby form the TFT source regions 115 and 115*a* and the TFT drain region 116. For instance, the silicon film 125 is implanted at 10 KeV to 30 KeV with doses of $1\times10^{14} - 1\times10^{15}$ cm$^{-2}$ boron. The boron ions are not implanted into portions of the TFT silicon film 125 located just beneath the TFT gate electrode 119*a*, because the TFT gate electrode 119*a* acts as a mask to thereby not allow boron ions to be introduced into the portions. However, the portions have already been heavily doped with boron ions 130, as having been explained with reference to FIG. 6B, and thus make the heavily impurity-doped region 129.

Then, as illustrated in FIG. 5, TFT is entirely covered with the third interlayer insulating film 121, on which the bit line 124 made of aluminum is formed. Thus, a TFT load SRAM cell is completed. The bit line 124 is in contact with the N+ diffusion layer 108 through the bit line contact plug 123 filling the bit line contact hole 122 therewith.

In accordance with the above mentioned first embodiment, a region entirely surrounded by the TFT gate electrode 119*a* has been in advance doped with impurities to thereby form the heavily impurity-doped region 129. Accordingly, there is not formed a high resistant region between the TFT drain region 116 and the TFT gate electrode 119*a* in the first embodiment.

Hereinbelow will be explained a semiconductor memory device in accordance with the second embodiment of the present invention with reference to FIGS. 7 and 8A to 8D. As mentioned later, a TFT gate electrode in the second embodiment has a two-layered structure including upper and lower polysilicon layers. An inner surface of a contact hole connecting TFT to MOSFET formed on a silicon substrate is covered only with the upper polysilicon layer.

Figure 7:
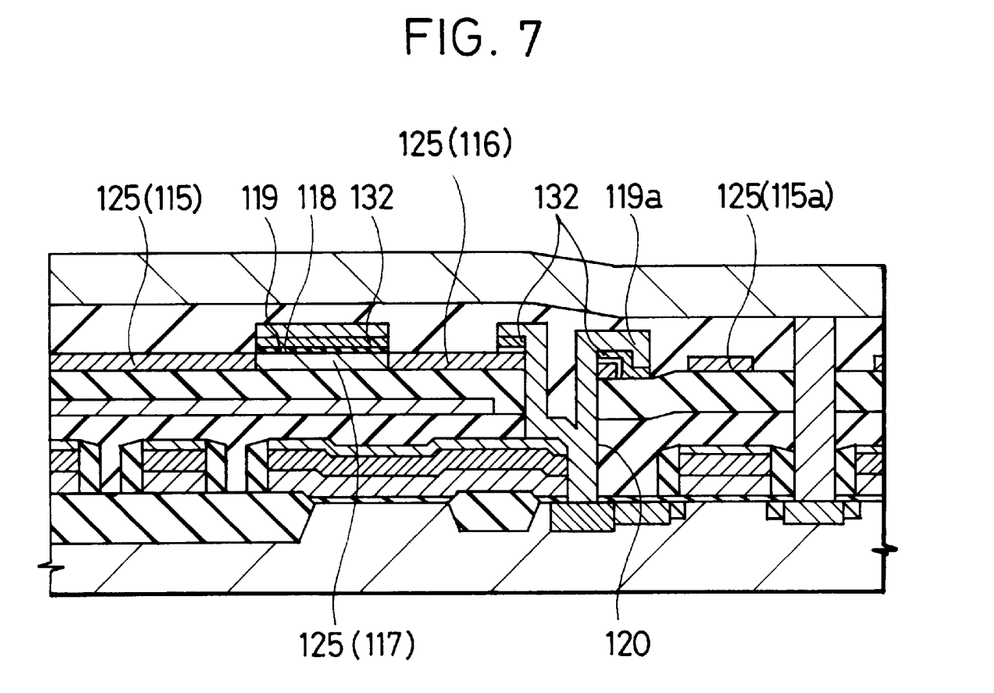
FIG. 7 is a cross-sectional view of a TFT load SRAM cell made in accordance with the second embodiment of the present invention.

MOSFET formed on a silicon substrate has the same structure as that of the first embodiment, and thus will not be explained. TFT in the second embodiment has a structure as follows. TFT is formed on the second interlayer insulating film 114 above the grounding wire 113. The TFT working as a load transistor includes a TFT silicon film 125 in which TFT source regions 115 and 115*a*, a TFT drain region 116, a TFT channel region 117 disposed between the source and drain regions 115 and 116 are formed. On the TFT channel region 117 is formed a TFT gate insulating film 118, on which is formed a gate electrode 132 for protecting the underlying films. On the protective gate electrode 132 is formed a TFT gate electrode 119.

There is also formed a protective gate electrode 132*a* partially covering the TFT drain region 116. The protective gate electrode 132*a* is covered with a TFT gate electrode 119*a*. The TFT gate electrode 119*a* makes contact with the TFT drain region 116 and protective gate electrode 132*a* at side surfaces thereof. The TFT gate electrode 119*a* covers an inner surface of a contact hole 120, and has a portion making contact at a bottom of the contact hole 120 with the silicon film 106, the tungsten silicide film 105, the polysilicon film 104 and the N+ diffusion layer 110.

As illustrated in FIG. 5, TFT having the above mentioned structure is covered with a third interlayer insulating film 121, on which a bit line 124 made of aluminum is formed. Thus, a TFT load SRAM cell is completed. The bit line 124 is in contact with the N+ diffusion layer 108 through a bit line contact plug 123 filling a bit line contact hole 122 therewith. The contact plug 123 is made of tungsten.

FIGS. 8A to 8D illustrate cross-sectional views of the above mentioned SRAM cell, showing fabrication steps of a method of fabricating the same.

Figure 8A:
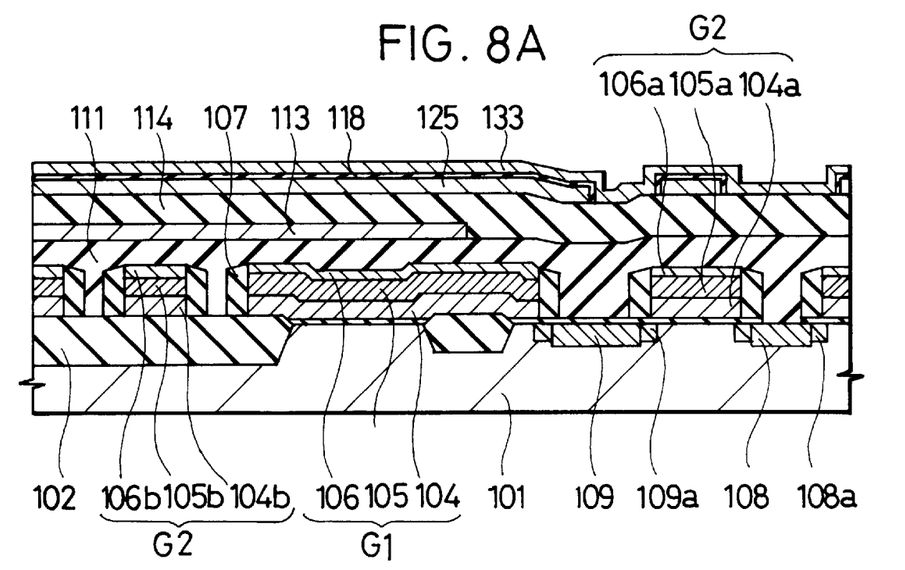
FIGS. 8A to 8D are cross-sectional views of the TFT load SRAM cell illustrated in FIG. 7, showing respective steps of a method of fabricating the same.

First, as illustrated in FIG. 8A, the field oxide films 102 having a thickness of 200 nm are formed by selective oxidation on the p-type silicon substrate 101 having an impurity concentration in the range of $1\times10^{16}$ to $1\times10^{17}$ cm$^{-3}$. There is further formed the gate oxide film 103 having a thickness of 8 nm in a device activation region at a surface of the silicon substrate 101, namely in a region defined between the field oxide films 102. Then, the gate electrode G1 of a driver transistor is formed in the device activation region on the gate oxide film 103. The gate electrode G1 has a three-layered structure, and is formed by depositing the n-type impurities doped polysilicon film 104 having a thickness of 50 nm, the tungsten silicide film 105 having a thickness of 100 nm, and the silicon film 106 having a thickness of 30 nm, on the gate oxide film 103 in this order, and further patterning them by means of photolithography and etching. Similarly, the gate electrodes C2 of the transfer transistors, which act as word lines, are formed on the gate oxide film 103. The gate electrodes G2 are comprised of polysilicon films 104a and 104b, tungsten silicide films 105a and 105b, and silicon films 106a and 106b. The gate electrodes G2 are formed in the same manner as that of the gate electrode G1.

Then, ion implantation is carried out to the silicon substrate 101 by using the gate electrode G2 as a mask to thereby form the lightly impurity-doped diffusion layers or N− diffusion layers 108a and 109a at a surface of the silicon substrate 101. The layers 108a and 109a have an impurity concentration in the range of $1 \times 10^{17}$ to $1 \times 10^{18}$ cm$^{-3}$. Then, the sidewall insulating films 107 made of silicon dioxide are formed on sidewalls of the gate electrodes G1 and G2. Then, ion implantation is carried out to the silicon substrate 101 with the gate electrodes G1 and G2 and the sidewall insulating films 107 being used as a mask to thereby form the heavily impurity-doped diffusion layers or N+ layers 108 and 109 located adjacent to the N− diffusion layers 108a and 109a formed just below the sidewall insulating films 107. The N+ layers 108 and 109 have an impurity concentration in the range of $1 \times 10^{20}$ to $1 \times 10^{21}$ cm$^{-3}$.

Then, a resultant is covered with the first interlayer insulating film 111 made of silicon dioxide by means of CVD. Then, the grounding wire 113 having a thickness in the range of 150 to 300 nm and made of a tungsten silicide film is formed on the first interlayer insulating film 111. Then, the grounding wire 113 and the first interlayer insulating film 111 are covered with the second interlayer insulating film 114, on which in turn is formed the silicon film 125 from which TFT will be made.

Then, a TFT gate insulating film 118 having a thickness of 15 nm is formed over the silicon film 125. Then, a resultant is covered with a protective silicon film 133 which is made of polysilicon and has a thickness of 20 nm. The protective silicon film 133 contains phosphorus therein as impurities.

Then, the patterned resist mask 126 having a thickness in the range of 200 nm to 300 nm is formed over a resultant. The mask insulating film 126 is a silicon nitride film deposited by CVD. Then, there is formed a patterned resist mask 127 over the mask insulating film 126. Then, there is formed a hole 128 in the mask insulating film 126 by anisotropic etching with the resist mask 127 being used as an etching mask. The hole 128 has coaxially a greater diameter than a diameter of the contact hole 120, similarly to the first embodiment.

Figure 8B:
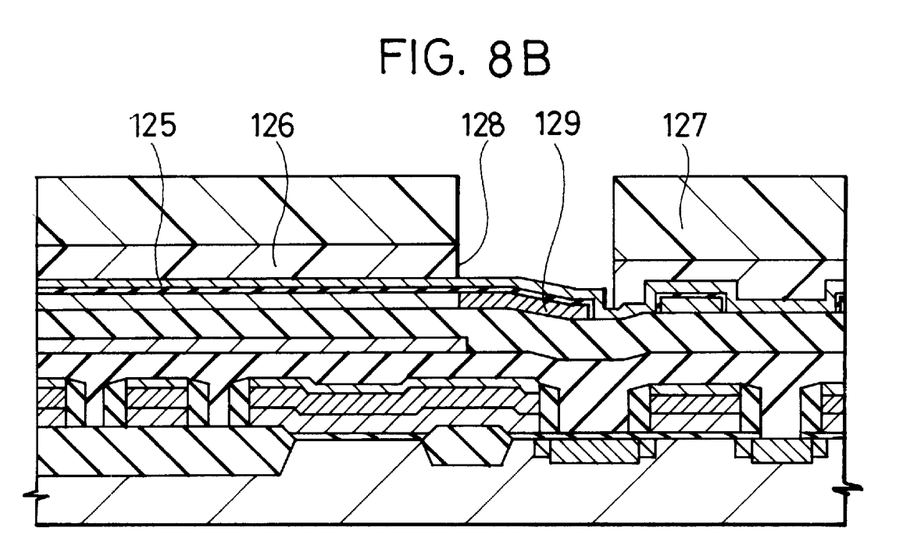

Then, as illustrated in FIG. 8B, boron ions are implanted to the silicon film 125 with the mask insulating film 126 and the resist mask 127 being used as a mask. Thus, there is formed the heavily impurity-doped region 129 in a portion of the silicon film 125 which appears in the hole 128. For instance, the silicon film 125 is implanted at 50 KeV with doses of $1 \times 10^{14} - 1 \times 10^{15}$ cm$^{-2}$.

Figure 8C:
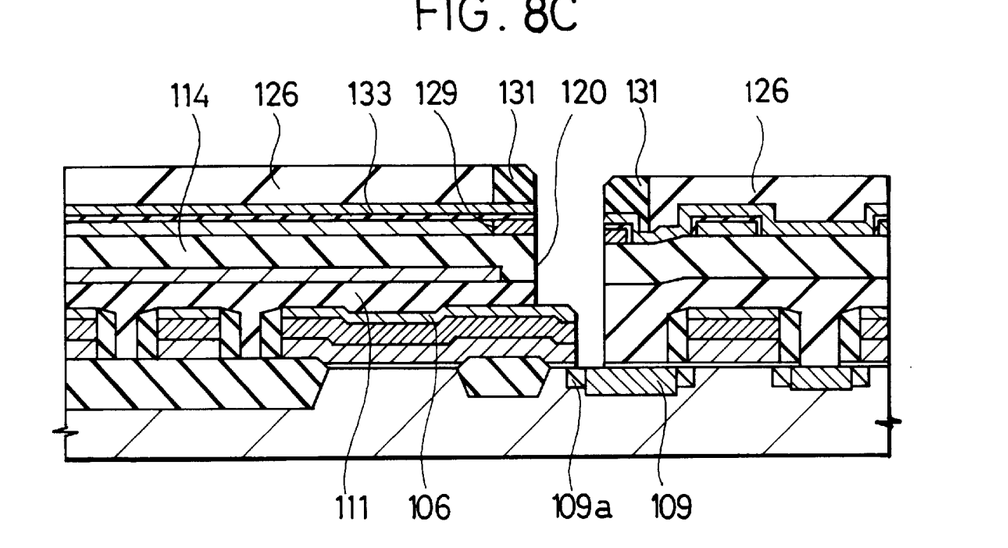

Then, as illustrated in FIG. 8C, the resist mask 127 is removed, and thereafter a silicon nitride film is deposited all over a resultant and then anisotropically etched. Thus, there are formed the sidewall masks 131 on an inner wall of the hole 128 and in continuation with the mask insulating film 126.

Then, the protective silicon film 133, the heavily impurity-doped region 129, the second interlayer insulating film 114 and the first interlayer insulating film 111 are successively dry etched with the mask insulating film 126 and the sidewall masks 131 being used as an etching mask. Thus, there is formed the contact hole 120 in which the silicon film 106 and the N+ diffusion layer 109 partially appears.

Figure 8D:
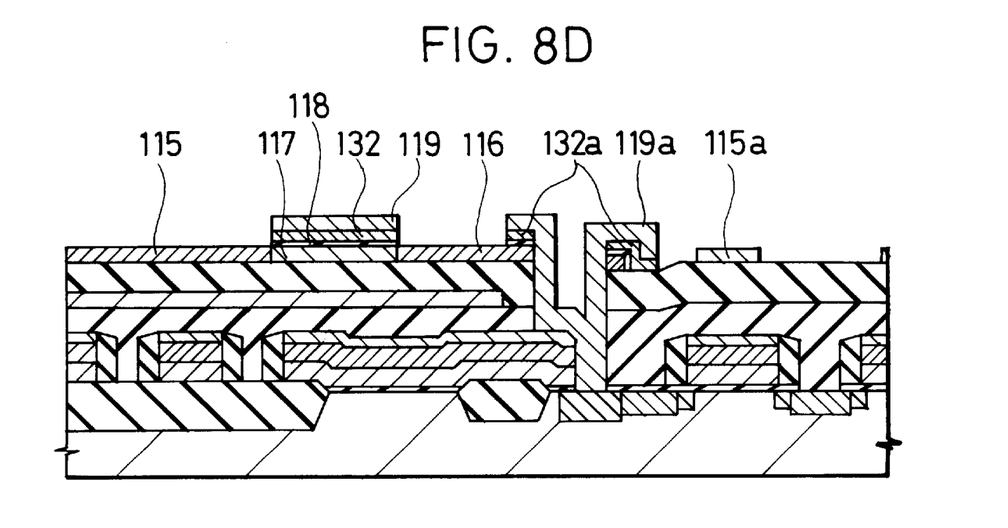

Then, as illustrated in FIG. 8D, after the mask insulating film 126 and the sidewall mask 131 are removed, there are formed the TFT gate electrodes 119 and 119a both made of a polysilicon film containing n-type impurities doped thereinto and having a thickness of 150 nm. The protective silicon film 133 is patterned to thereby form protective the gate electrodes 132 and 132a which are sandwiched between the TFT gate electrodes 119,119a and the TFT gate insulating film 118.

Then, boron ion implantation is carried out into the TFT silicon film 125 with the TFT gate electrodes 119, 119a and the protective gate electrodes 132, 132a being used as a mask to thereby form the TFT source regions 115 and 115a and the TFT drain region 116. For instance, the silicon film 125 is implanted at 10 KeV to 30 KeV with doses of $1 \times 10^{14} - 1 \times 10^{15}$ cm$^{-2}$. The boron ions are not implanted into portions of the TFT silicon film 125 located just beneath the TFT gate electrode 119a and the protective gate electrode 132a, because the TFT gate electrode 119a and the protective gate electrode 132a act as a mask to thereby not allow boron ions to be introduced into the portions. However, the portions have already been heavily doped with boron ions, and thus make the heavily impurity-doped region 129. Subsequent steps are carried out similarly to the first embodiment.

In accordance with the second embodiment, the mask insulating film 126 never lies directly on the TFT gate insulating film 118. Hence, when the mask insulating film 126 and the sidewall mask 131 are removed, the TFT gate insulating film 118 is never damaged, resulting in more stable characteristics of TFT.

In the above mentioned first and second embodiments, phosphorus or arsenic may be employed in place of boron in the ion implantation step explained with reference to FIG. 6B, to thereby implant n-type impurities into the heavily impurity-doped region 129. A n-typed silicon substrate having a p-well layer formed at a surface of the substrate may be used in place of a p-type silicon substrate.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-76097 filed on Mar. 29, 1997 including specification, claims, drawings and summary is incorporated herein by reference in its entirety.

What is claimed is:

1. A semiconductor memory device, comprising:

a semiconductor substrate;

a pair of transfer transistors formed on said substrate;

a pair of driver transistors formed on said substrate; and first and a second thin film load transistors formed above said transfer transistors and said driver transistors with an interlayer insulative film sandwiched between; and a drain region of said first thin film load transistor having at least one portion over which a gate electrode of said second thin film load transistor partially lies, said portion being heavily doped with impurities, said gate electrode of said second thin film load transistor having a two-layered structure including upper and lower polysilicon layers.

2. The semiconductor memory device as set forth in claim 1, wherein said upper layer contains impurities having conductivity opposite to conductivity of said semiconductor substrate.

3. A semiconductor memory device, comprising:

a semiconductor substrate;

a pair of transfer transistors formed on said substrate;

a pair of driver transistors formed on said substrate; and first and a second thin film load transistors formed above said transfer transistors and said driver transistors with an interlayer insulative film sandwiched between;

a drain region of said first thin film load transistor having at least one portion over which a gate electrode of said second thin film load transistor partially lies, said portion being heavily doped with impurities, said gate electrode of said second thin film load transistor having a two-layered structure including upper and lower layers; and a contact hole electrically connecting a gate electrode of said driver transistors to a drain region of said first thin film load transistor having an inner surface covered only with said upper layer.

4. The semiconductor memory device as set forth in claim 3, wherein said upper and lower layers are made of polysilicon.

5. The semiconductor memory device as set forth in claim 4, wherein said upper layer contains impurities having conductivity opposite to conductivity of said semiconductor substrate.

* * * * *